United States Patent [19]

Marks et al.

[11] Patent Number: 5,244,841
[45] Date of Patent: *Sep. 14, 1993

[54] METHOD FOR PLANARIZING AN INTEGRATED CIRCUIT STRUCTURE USING LOW MELTING INORGANIC MATERIAL AND FLOWING WHILE DEPOSITING

[75] Inventors: Jeffrey Marks, Sunnyvale; Kam S. Law, Union City; David N. Wang, Saratoga; Dan Maydan, Los Altos Hills, all of Calif.

[73] Assignee: Applied Materials, Inc., Santa Clara, Calif.

[*] Notice: The portion of the term of this patent subsequent to Oct. 9, 2007 has been disclaimed.

[21] Appl. No.: 805,423

[22] Filed: Dec. 10, 1991

Related U.S. Application Data

[63] Continuation of Ser. No. 644,853, Jan. 22, 1991, Pat. No. 5,112,776, which is a continuation of Ser. No. 541,449, Jun. 21, 1990, abandoned, which is a continuation of Ser. No. 269,508, Nov. 10, 1988, abandoned.

[51] Int. Cl.$^5$ ............................................. H01L 21/465
[52] U.S. Cl. .................................. 437/228; 437/235; 437/236; 437/240; 437/247; 437/982; 148/DIG. 133
[58] Field of Search ............... 437/228, 235, 236, 240, 437/982, 247; 156/643; 148/DIG. 133

[56] References Cited

U.S. PATENT DOCUMENTS

| | | | |
|---|---|---|---|
| 3,755,720 | 8/1973 | Kern | 317/234 R |
| 4,417,914 | 11/1983 | Lehrer | 65/60.53 |
| 4,506,435 | 3/1985 | Pliskin et al. | 29/576 W |
| 4,599,135 | 7/1986 | Tsunekawa et al. | 156/643 |
| 4,714,520 | 12/1987 | Gwozdz | 437/228 |
| 4,781,945 | 11/1988 | Nishimura et al. | 427/255.3 |
| 4,807,016 | 2/1989 | Douglas | 357/67 |
| 4,872,947 | 10/1989 | Wang et al. | 156/643 |
| 4,962,063 | 10/1990 | Maydan et al. | 437/228 |

FOREIGN PATENT DOCUMENTS

| | | |
|---|---|---|
| 0023146 | 7/1980 | European Pat. Off. |
| 0049400 | 9/1981 | European Pat. Off. |
| 0062722 | 12/1981 | European Pat. Off. |
| 0098687 | 5/1983 | European Pat. Off. |
| 56-48140 | 5/1981 | Japan |
| 56-076548 | 6/1981 | Japan |
| 59-044831 | 3/1984 | Japan |
| 61-260639 | 11/1986 | Japan |
| 923338 | 4/1959 | United Kingdom |

OTHER PUBLICATIONS

"2244 Research Disclosure", Dec., 1989, No. 308, New York.
Smith, Gregory, et al., "Sidewall-Tapered Oxide by Plasma-Enhanced Chemical Vapor Deposition", *Journal of the Electrochemical Society*, vol. 132, No. 11, Nov., 1985, pp. 2721-2725.
Spindler, O., et al., "In Situ Planarization of Intermetal Dielectrics; Process Steps: Degree of Planarization and Film Properties", *2194 Thin Solid Films*, vol. 175, No. 1 Aug., 1989, pp. 67-72.

*Primary Examiner*—Brian E. Hearn
*Assistant Examiner*—Tuan Nguyen
*Attorney, Agent, or Firm*—John P. Taylor

[57] ABSTRACT

A planarizing process is disclosed for planarizing an integrated circuit structure using a low melting inorganic planarizing material which comprises flowing while depositing a low melting inorganic planarizing layer such as a boron oxide glass over a layer if insulating material such as an oxide of silicon and then dry etching the low melting inorganic planarizing layer to planarize the structure. The method eliminates the need for separate coating, drying, and curing steps associated with the application of organic-based planarizing layers usually carried out outside of a vacuum apparatus. In a preferred embodiment, the deposition steps and the etching step are carried out without removing the integrated circuit structure from the vacuum apparatus. An additional etching step may be carried out after depositing the insulating layer and prior to deposition of the planarizing layer to remove any voids formed in the insulating layer.

9 Claims, 4 Drawing Sheets

METHOD FOR PLANARIZING AN INTEGRATED CIRCUIT STRUCTURE USING LOW MELTING INORGANIC MATERIAL AND FLOWING WHILE DEPOSITING

CROSS REFERENCE TO RELATED APPLICATIONS

This application is a continuation of Marks et al. Ser. No. 07/644,853, filed Jan. 22, 1991 now U.S. Pat. No. 5,112,776 as a continuation of Marks et al. Ser. No. 07/541,449, filed Jun. 21, 1990, abandoned as a continuation of Marks et al. Ser. No. 07/269,508, filed Nov. 10, 1988, abandoned.

BACKGROUND OF THE INVENTION

Field of the Invention

This invention relates to a method for planarizing an integrated circuit structure. More particularly, this invention relates to a method for planarizing an integrated circuit structure using a low melting glass which is deposited over a layer of insulating material and then etched back. In a preferred embodiment, the etching step is carried out after the deposition step without an intervening exposure of the structure to ambient atmosphere, thus permitting the use of hygroscopic low melting glasses as planarizing material.

Description of the Related Art

In the formation of integrated circuit structures, patterning of layers to permit formation on a substrate of active devices such as transistors, passive devices such as resistors, and metal lines to interconnect devices, can result in the formation of uneven surfaces.

When a layer of insulating material such as silicon oxide is applied over such uneven surfaces, to permit the formation of further patterned layers thereover, the silicon oxide tends to conform to the underlying topography resulting in the creation of a nonplanar or stepped surface. It is very difficult to pattern further layers over such an uneven surface using standard lithography techniques.

It has, therefore, become the customary practice to apply planarizing layers of either photoresist or organic-based glass materials, such as "SOG" (Spin On Glass) which will etch at about the same rate as the underlying silicon oxide insulating layer. The structure is then anisotropically etched to remove the planarizing layer, as well as raised portions of the underlying silicon oxide layer.

However, both photoresist and SOG have what is called as a loading effect. This means that the etch rate of these materials depends upon how much of the insulating layer, e.g., the silicon oxide layer, is exposed. Thus, achieving an equal etch rate of both insulating material (silicon oxide) and the sacrificial or planarizing material is very difficult and the etch rate is, therefore, dependent upon the geometry of the structure. Furthermore, when the spaces between raised portions are less than about 1.5 microns, the spinning process of applying either of these two planarizing materials is not effective.

The above described planarizing materials also have limited step coverage and are also limited with respect to the total amount or thickness of these materials which can be deposited. Furthermore, since these planarizing materials are dispersed in organic binders and solvents, prior to application of such planarizing materials, the integrated circuit structure must be removed from a vacuum chamber in which the insulating layer such as silicon oxide is deposited, e.g., by CVD methods, in order to coat the structure with the planarizing layer. After such coating, the solvent in the planarizing coating must be allowed to evaporate and the planarizing coating must then be baked to remove further solvents and to harden the coating prior to the etching step, which is conventionally a dry etching process which is also usually carried out in a vacuum chamber.

Thus, the present planarizing processes not only yield unsatisfactory results, but also result in the need for a number of additional and time consuming intermediate steps outside of the vacuum apparatus which is normally used for the preceding CVD deposition of the underlying insulating layer as well as for the subsequent dry etching step which normally follows the formation of such a planarizing layer. Such additional steps not only add expense to the process, but also risk the possible introduction of undesirable contaminants to the surface of the integrated circuit structure by exposure of the integrated circuit structure to the atmosphere.

It would, therefore, be highly desirable to be able to planarize an integrated circuit structure without the use of such organic-based planarizing materials which require removal of the integrated circuit structure from the vacuum system for application, drying, and baking of a planarizing layer.

SUMMARY OF THE INVENTION

It is, therefore, an object of this invention to provide a process for planarizing an integrated circuit structure using a low melting inorganic planarizing material.

It is another object of this invention to provide a process for planarizing an integrated circuit structure which comprises the steps of depositing a layer of a low melting inorganic planarizing material over an integrated circuit structure and etching the inorganic planarizing layer.

It is another object of this invention to provide a process for planarizing an integrated circuit structure using a low melting inorganic planarizing material which comprises the steps of depositing a layer of an insulating material over an integrated circuit structure, then depositing a layer of a low melting inorganic planarizing material over the coated integrated circuit structure, and then dry etching the inorganic planarizing layer.

It is yet another object of this invention to provide a process for planarizing an integrated circuit structure using an inorganic planarizing material which comprises the steps of depositing a layer of an insulating material over an integrated circuit structure, then depositing a layer of a low melting inorganic planarizing material over the coated integrated circuit structure in the same deposition apparatus, and then dry etching the inorganic planarizing layer.

It is still another object of this invention to provide a process for planarizing an integrated circuit structure using an inorganic planarizing material which comprises the steps of chemically vapor depositing a layer of an insulating material over an integrated circuit structure, then chemically vapor depositing a layer of a low melting inorganic planarizing material over the coated integrated circuit structure in the same deposition apparatus, and then anisotropically dry etching the inorganic planarizing layer by moving the coated integrated circuit structure to an etching zone within the same apparatus without exposing the coated structure to the ambient atmosphere.

It is a further object of this invention to provide a process for planarizing an integrated circuit structure using an inorganic planarizing material which comprises the steps of chemically vapor depositing a layer of an insulating material over an integrated circuit structure having closely spaced apart raised portions and removing at least a portion of said insulating material from the sidewalls of the raised portions, then chemically vapor depositing a layer of a low melting inorganic planarizing material over the coated integrated circuit structure in the same deposition apparatus, and then dry etching the inorganic planarizing layer by moving the coated integrated circuit structure to an etching zone within the same apparatus without exposing the coated structure to the ambient atmosphere.

It is yet a further object of this invention to provide a process for planarizing an integrated circuit structure using an inorganic planarizing material which comprises the steps of chemically vapor depositing a layer of an insulating material over an integrated circuit structure having closely spaced apart raised portions and thereafter removing at least a portion of said insulating material from the sidewalls of the raised portions, then chemically vapor depositing a layer of a low melting inorganic planarizing material over the coated integrated circuit structure in the same deposition apparatus, and then dry etching the inorganic planarizing layer by moving the coated integrated circuit structure to an etching zone within the same apparatus without exposing the coated structure to the ambient atmosphere.

It is another object of this invention to provide a process for planarizing an integrated circuit structure using an inorganic planarizing material which comprises the steps of chemically vapor depositing a layer of an insulating material over an integrated circuit structure having closely spaced apart raised portions and simultaneously removing at least a portion of said insulating material from the sidewalls of the raised portions, then chemically vapor depositing a layer of a low melting inorganic planarizing material over the coated integrated circuit structure in the same deposition apparatus, and then dry etching the inorganic planarizing layer by moving the coated integrated circuit structure to an etching zone within the same apparatus without exposing the coated structure to the ambient atmosphere.

It is a further object of this invention to provide a process for planarizing an integrated circuit structure using a low melting glass as an inorganic planarizing material which comprises the steps of chemically vapor depositing a layer of silicon oxide over an integrated circuit structure, then chemically vapor depositing a layer of a low melting glass planarizing material over the coated integrated circuit structure in the same deposition apparatus, and then anisotropically dry etching the low melting glass planarizing layer by moving the coated integrated circuit structure to an etching zone within the same apparatus without an interim exposure of the coated structure to the ambient atmosphere.

DETAILED DESCRIPTION OF THE INVENTION

In its broadest aspects, the invention provides an improved planarization process for integrated circuit structures wherein a low melting inorganic planarizing material is deposited over a conformal insulating layer such as silicon oxide followed by etching of the planarizing layer. By using a low melting inorganic planarizing material such as a low melting glass, no intermediate deposition or coating, solvent evaporation, or baking steps need be carried out outside of the vacuum apparatus and the same apparatus may be used to deposit the low melting inorganic planarizing material as is used to deposit the underlying insulating layer.

Figure 1:
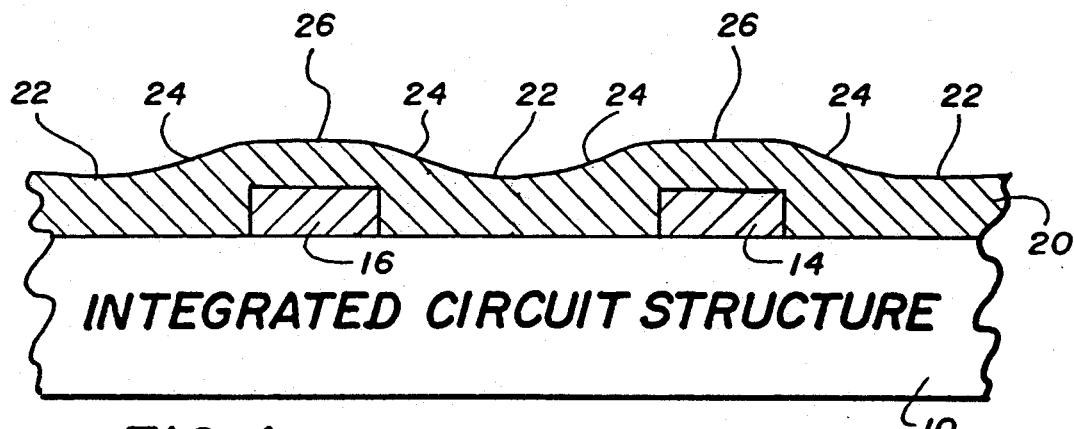
FIGS. 1-3 are fragmentary vertical cross-sectional views which sequentially illustrate the process of the invention.

Turning now to FIG. 1, portions of a typical integrated circuit structure are generally shown as layer 10 which may include a substrate such as silicon, one or more doped or undoped buried layers, one or more doped or undoped epitaxial layers, one or more doped or undoped polysilicon layers, oxide isolation and insulation portions or layers, etc. Shown formed on integrated circuit structure 10, by way of illustration and not of limitation, are two spaced apart metal lines 14 and 16. An insulating layer 20 of a material such as silicon oxide is deposited over integrated circuit structure 10 and metal lines 14 and 16 in preparation for the formation thereon of further patterned layers such as, for example, a metal wiring harness which will interconnect metal lines 14 and/or 16 with other portions of integrated circuit structure 10.

Insulation material 20 may comprise an oxide of silicon or a silicate such as phosphorus silicate when the underlying integrated circuit structure comprises silicon. A nitride or oxynitride of silicon may also be used when the underlying structure comprises silicon. The insulation material may be either a doped or undoped material. Other insulation materials may, of course, be used as well and may even be preferred over those just named when the underlying structure comprises some other material than silicon, e.g., germanium, gallium arsenide, etc.

In this regard, it should be noted that the process may be used whenever it is desired to planarize an integrated circuit structure having raised portions with respect to the portion of the substrate structure therebetween. Thus, the process may be used for front end application such as dielectric planarization, for filling trenches or slots, or for top side planarization as well as the illustrated intermetal planarization. For example, when using the process in a front end application, the use of boron phosphorus silicate glass (BPSG) may be eliminated and a phosphorus silicate glass (PSG) may be substituted for the BPSG as the insulating material to be planarized. The process may also be used to planarize an integrated circuit structure prior to a blanket deposit of another metal layer such as tungsten.

By use of the term "raised portions" is meant portions of an integrated circuit structure raised with respect to the height of the surface therebetween and thus may include not only structures raised with respect to the entire surface but also the raised sidewalls, for example, of a trench or slot with respect to the bottom of the trench.

By way of example, when insulation layer 20 comprises silicon oxide, it may be deposited over integrated circuit structure 10 and metal lines 14 and 16 thereon within a temperature range of from about 20° C. to about 350° C. in a plasma CVD apparatus to an appropriate thickness which may range from about 1000 Angstroms to about 3 microns, typically about 1 micron.

It will be readily seen in FIG. 1 that the application of an insulation material such as silicon oxide as insulating layer 20 results in the formation of a very conformal layer having steps or shoulders 24 interconnecting low regions 22 with raised regions 26 in conformity with the raised metal lines 14 and 16 thereunder.

As a result of this conformity of insulating layer 20 to the underlying raised portions of the integrated circuit structure and the resulting uneven or stepped geometry of insulating layer 20, patterning of a subsequently applied layer by photolithography would be very difficult.

Therefore, in accordance with the invention, a planarizing layer 30 of a low melting inorganic material, such as a low melting glass, is first applied over insulating layer 20, and then the coated structure is subjected to a planarizing etch step to remove planarizing layer 30 as well as the higher regions 24 and 26 of underlying insulating layer 20.

Low melting inorganic planarizing material 30 may comprise any inorganic material which: a) may be deposited on the surface of insulating layer 20 without the use of a solvent; b) which does not need to be subsequently cured or baked to harden the deposited material sufficiently to permit etching thereof; and c) is capable of being etched, preferably dry etched, at approximately the same rate as the underlying insulation layer.

In a preferred embodiment, low melting inorganic planarizing material 30 comprises a material which may be deposited over insulating layer 20 using the same chemical vapor deposition apparatus as used to deposit insulating layer 20 on integrated circuit structure 10.

By "low melting" is meant a material which has a melting point of about 575° C. or lower, and which will flow at about 500° C. or lower, i.e., from about 100° to about 500° C. In a preferred embodiment where the process will be used over low melting materials already present in the integrated circuit structure such as aluminum, e.g., over aluminum lines or in topside applications, the melting point should not exceed about 480° C. with a flow of 390° C. or lower. The use of a material which will flow at about 390° C. or lower will result in the flowing of the material over the underlying surface without risk of any harm to the underlying integrated circuit structure.

By way of example, the low melting inorganic planarizing material comprises a low melting glass. Examples of such low melting glasses include $B_2O_3$, $B_2S_6$, $B_2O_3$/$SiO_2$ mixtures, $As_2O_3$, $As_2S_3$, $P_2O_5$ or any combinations of the above.

By using a low melting planarizing material such as a low melting glass, planarizing material 30 may be deposited using, for example, the same CVD methods and apparatus used to deposit the insulating material 20 such as silicon oxide. Thus, a deposition of a low melting glass such as, for example, $B_2O_3$ at from about 390° C. to about 480° C., at which temperature the planarizing material will flow over the stepped surface of insulating layer 20 on integrated circuit structure 10, will result in the generally planar surface 32 on layer 30 shown in FIG. 2.

A lower deposition temperature may, of course, be used if the material is subsequently heated sufficiently to cause the planarizing material to flow over the surface. However, usually such an additional heating step will be avoided if possible. A lower deposition temperature may also be used provided that the low melting planarizing material has a flow point temperature at least as low as the deposition temperature so that the planarization material will flow as it is deposited.

The use of the same apparatus for deposition of both layers 20 and 30, together with the selection of a low melting inorganic material as the planarizing material which does not use solvents which must be removed, and which does not require further baking or curing prior to etching, permits the preferential carrying out of the two deposition steps sequentially in the same deposition apparatus without intermediate removal of the integrated circuit structure from the vacuum deposition apparatus. This not only reduces the total number of process steps, compared to the prior art planarizing processes, but additionally protects the integrated circuit structure from the risk of possible contamination which may occur whenever the integrated circuit structure is removed from the vacuum apparatus and exposed to the atmosphere.

It should be noted that both depositions may be carried out in the same deposition chamber or in separate chambers within the same apparatus which are interconnected in a manner which permits transfer of the integrated circuit structure from one chamber to another without exposure to the atmosphere and particularly to moisture and other contaminants in the atmosphere.

The low melting inorganic planarizing material is deposited onto the surface of insulating layer 20 within a temperature range of from about 100° C. to about 700° C., preferably about 300° C. to about 500° C., and under a pressure of from about 10 millitorr to about atmospheric pressure, preferably from a bout 2 to 30 torr, to a thickness of from about 200 Angstroms, at its thinnest point, up to about 2 microns in its thickness regions, i.e., overlying the low areas of the insulation layer beneath it. In a typical plasma CVD deposition of $B_2O_3$, the deposition temperature ranges from about 390° C. to about 440° C. at a pressure of about 9-10 torr with an rf plasma power of about 400-500 watts.

As discussed above, the application of a low melting inorganic planarizing material, using a deposition step similar to that used to deposit the underlying insulating layer, makes possible the use of the same deposition apparatus for both deposition steps. This has the dual advantage of reducing the number of processing steps as well as reducing the risk of contamination of the integrated circuit structure by unnecessary exposure of the structure outside of the vacuum apparatus.

Figure 3:
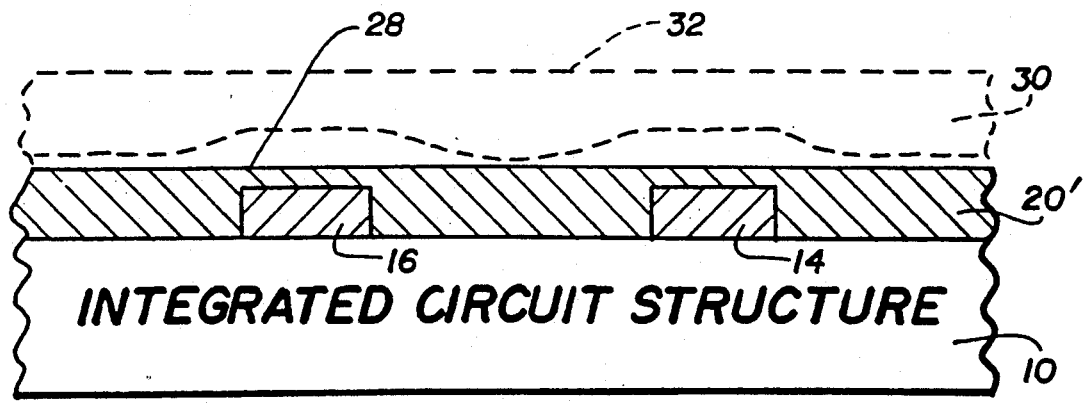

After deposition of the low melting inorganic planarizing material, the coated structure is then etched until substantially all of planarizing layer 30 has been removed, i.e., about 99.9% or more, as well as the high areas 26 and the stepped sides 24 of insulating layer 20, as shown at the top surface indicated by solid line 28 of FIG. 3, leaving a planarized portion 20' of insulating layer 20 approximately conforming in height to about the height of the lowest portions 22 of layer 20.

It should be noted, in this regard, that while surface line 28 is shown as substantially flat, the planarized surface may still have somewhat raised portions adjacent the underlying raised parts of the integrated circuit structure, e.g., above lines 14 and 16. However the 45° or higher slopes of the steps of the unplanarized insulation layer will be reduced down to about 10° to 15° or even lower after the planarization process of this invention.

It should also be noted that the final slope is controllable by varying the film thickness and/or deposition temperature used to deposit the planarizing material. Raising the deposition temperature reduces the slope because the planarizing material will flow better. Increasing the thickness of the planarizing material will also cause the film to flow more evenly across the underlying integrated circuit structure.

The etch step may comprise any etch system capable of etching both the planarizing layer 30 and underlying insulating layer 20 at approximately the same rate. The etchant may comprise any dry etch such as a conventional anisotropic etch. Preferably the dry etch will comprise a plasma etch using $CHF_3$ or $CF_4$ or argon. Examples of other dry etching systems useful in the practice of the invention include a sputter etching system or an RIE system.

Figure 4:
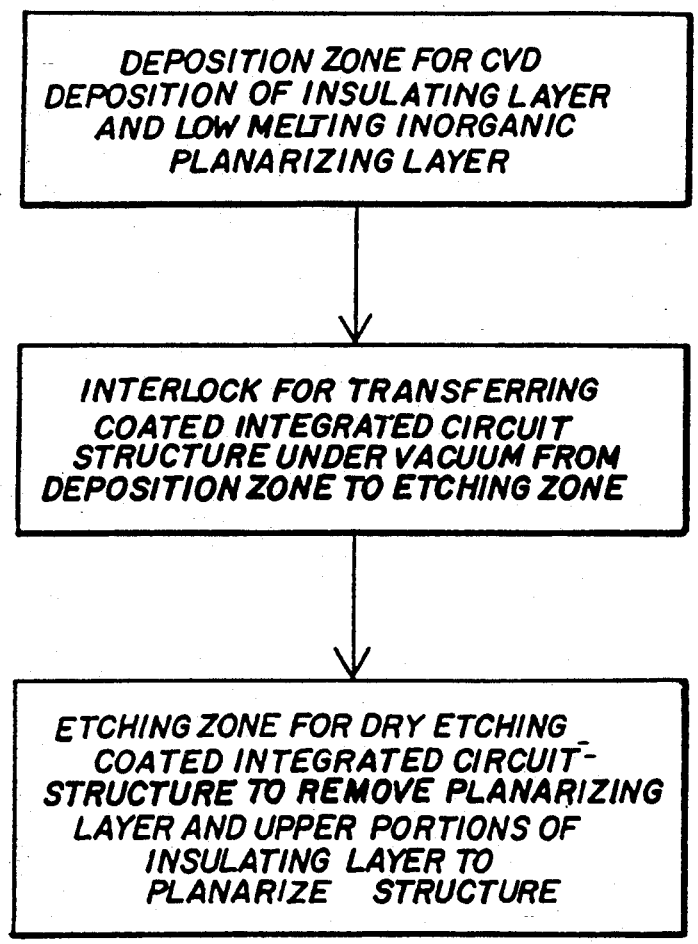
FIG. 4 is a flow sheet illustrating the movement of the integrated circuit structure from a deposition zone to an etching zone during the process.

In a particularly preferred embodiment of the invention, the integrated circuit structure, after having both the insulation layer and the planarizing layer deposited in the same deposition apparatus, is etched in another zone in the same apparatus while still maintaining the integrated circuit structure under vacuum. Thus, as shown in the flow chart of FIG. 4, the integrated circuit structure may be coated with both insulation layer 20 and planarizing layer 30 in a deposition zone, which may comprise the same or different deposition chambers in a common deposition apparatus, and then the coated structure may be moved to or through an interlock or intermediate chamber from which the coated structure may be moved to an etching zone without removing the coated structure from the vacuum apparatus.

Turning now to FIGS. 5-9, the steps of another embodiment of the invention are sequentially illustrated for the case where the close horizontal spacing between several adjacent raised shapes or structures on the surface of an integrated circuit structure, such as metal lines, may result not only in the formation of steps in an insulating layer deposited thereon, but also in the formation of voids in the overlying insulation material. This void formation may occur when the raised portions are closely spaced apart.

The term "closely spaced" may be defined as when, in an integrated circuit structure having raised portions or structures, the ratio of the height of the raised portions to the spacing between the raised portions is 0.5 or greater, e.g., where the height is 1 micron and the spacing is 2 microns or less. It may also be defined as the case whenever the spacing between the raised portions is less than about 1 micron.

Figure 5:
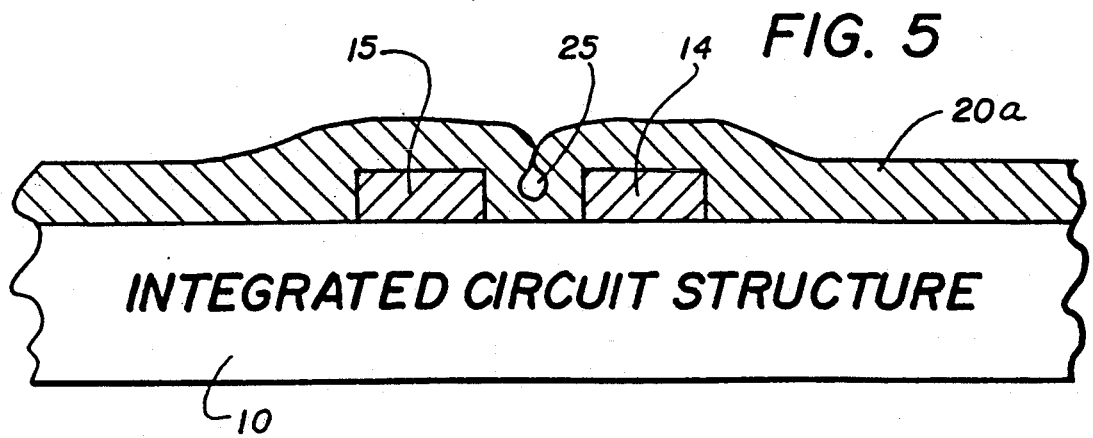
FIGS. 5-9 are fragmentary vertical cross-sectional views sequentially illustrating another embodiment of the process of the invention.

In this embodiment of the planarization process of the invention, an insulation layer 20a is deposited over integrated circuit structure 10 in similar fashion to the deposition shown in FIG. 1. However, due to the close spacing between the underlying structures, such as metal lines 14 and 15, a void 25 may be formed in the portion of insulation layer 20a deposited between the facing sidewalls of metal lines 14 and 15, as shown in FIG. 5.

Since subsequent planarization may open up the top of void 25, it is important that void 25 be removed prior to final planarization of the structure.

Figure 6:
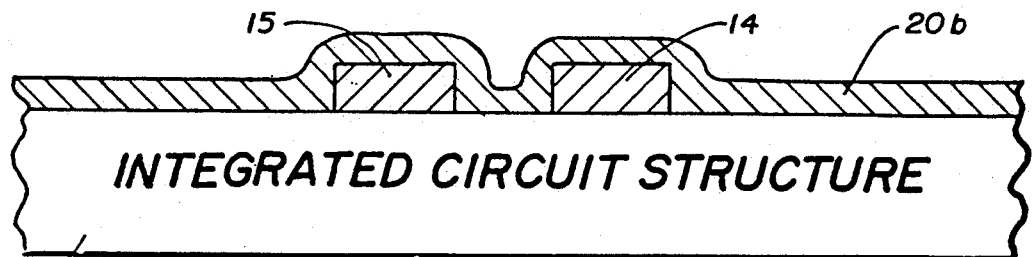

Therefore, as shown in FIG. 6, the structure is subjected to an etch step prior to deposition of the low melting inorganic planarization layer. This etch step is preferably an isotropic etch which will preferentially etch the less dense sidewall insulating material, e.g., silicon oxide material, leaving a portion of layer 20a designated as 20b in FIG. 6. This etching step is carried out until about 90% of the sidewall thickness has been removed.

While a wet etch, such as an HF or $NH_4F$ etch may be used here, it is preferred to use a dry etch since this again permits transfer of the coated structure from the deposition zone to an etching zone of the same vacuum apparatus without removal of the coated structure from the vacuum apparatus so that the risk of contamination is again minimized.

Examples of dry etchants which may be utilized as isotropic etchants for this step of the process include a $C_2F_6$ or $NF_3$ plasma etch within a temperature range of from about 80° C. to about 500° C., preferably about 350° C. to about 450° C., at a vacuum of about 100 millitorr to about 30 torr, preferably about 5 to 10 torr.

Figure 7:
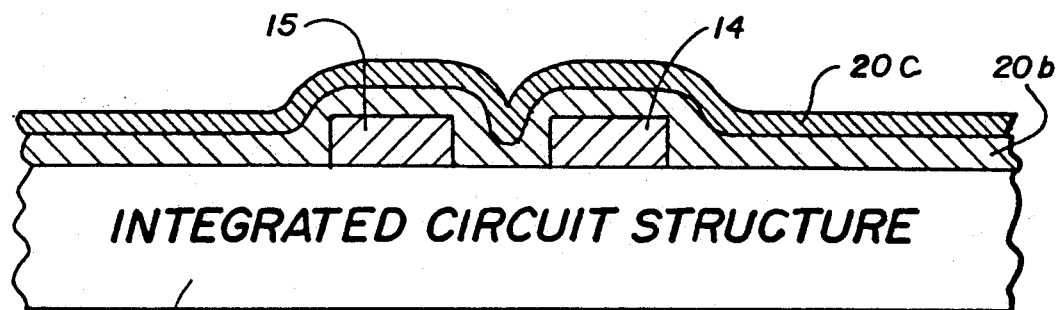
Figure 8:
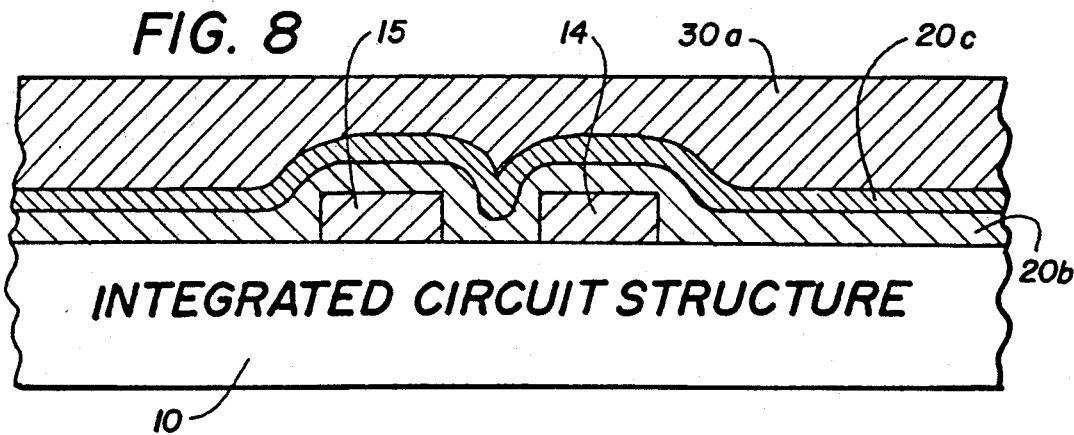

After the etching step is completed, a further layer of insulating material 20c may be deposited over etched layer 20b, as shown in FIG. 7, followed by deposition of the low melting inorganic planarizing material 30a, as shown in FIG. 8. Alternatively, planarizing material 30a may be deposited directly over the etched insulating layer 20b.

Figure 2:
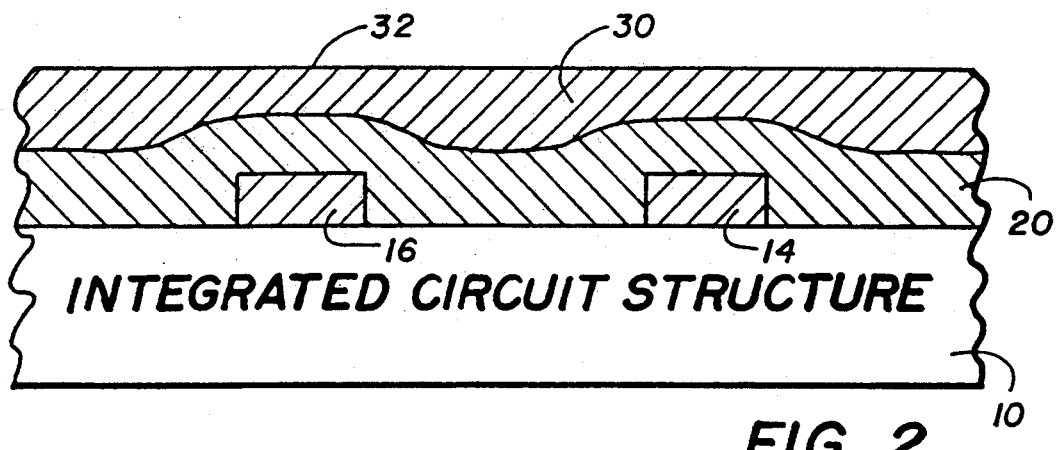
Figure 9:
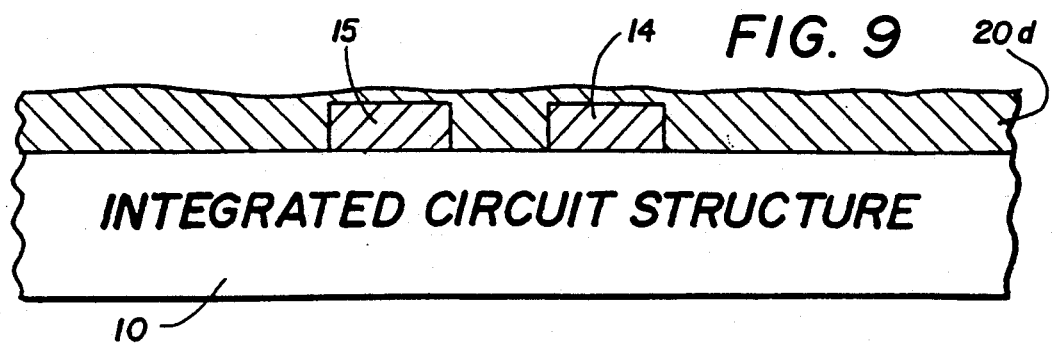
Figure 8B:
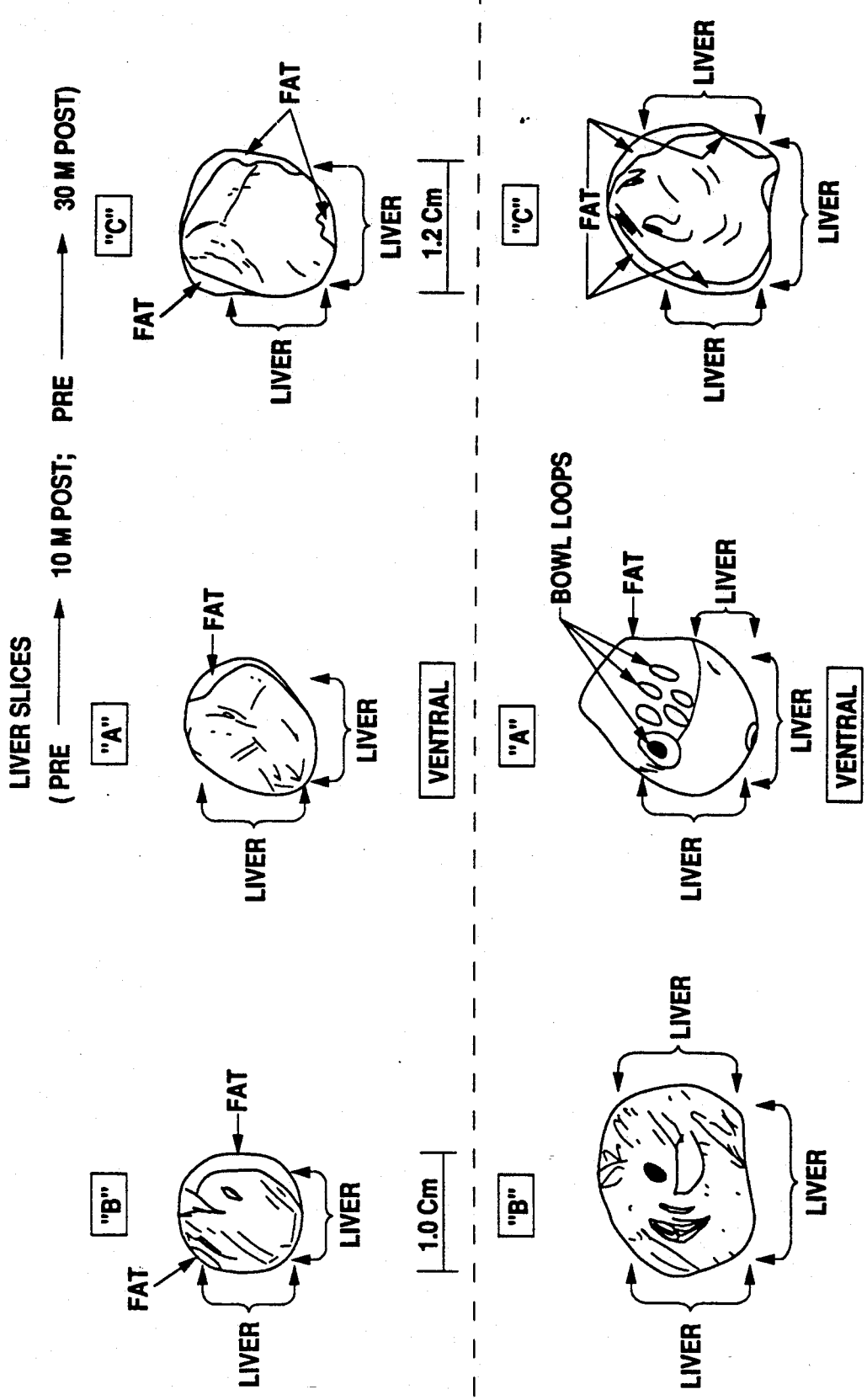

After the deposition of low melting inorganic planarizing layer 30a, either over second insulation layer 20c, as shown in FIG. 8, or directly over etched insulation layer 20b, the structure is subjected to an etch step, as described in the previous embodiment of FIGS. 1-3, to remove substantially all of planarizing layer 30a as well as the raised portions of the underlying insulation layer resulting in the structure shown in FIG. 9 with a planarized layer 20d of insulation material over integrated circuit structure 10 and metal lines 14 and 15.

In a variation on this embodiment when silicon oxide comprises insulation layer 20a, the vapor being deposited to form layer 20a may be mixed with an etchant such as a fluorine species, e.g., a $CF_4$, $C_2F_6$, or $NF_3$ gas, so that an in situ etch of the less dense silicon oxide sidewalls of layer 20a will occur during the deposition. The gaseous etchants may be mixed, for example, with the gaseous constituents used to deposit the silicon oxide in a ratio of about 1 to about 20 volume % etchant to provide a deposition vapor mixture which will form a layer of silicon oxide over integrated circuit structure 10 without forming voids between closely spaced together metal lines 14 and 15.

Thus, the invention provides a planarization process for removing the steps formed in an insulation layer deposited over an integrated circuit structure in which a low melting inorganic planarizing material is deposited over the insulation layer, preferably using the same deposition apparatus used to deposit the insulation layer to minimize the risk of contamination of the integrated circuit structure. The use of such a low melting inorganic planarization material, such as a low melting glass, eliminates the prior art steps of evaporating solvents, drying the planarization coating, and then baking the coating sufficiently to harden it.

The integrated circuit structure, having the low melting inorganic planarizing layer deposited thereon in accordance with the invention, is then etched to remove substantially all of the planarization layer as well as the high or stepped portions of the underlying insulation layer leaving a substantially planarized structure. Preferably the etch step is a dry etch step which is also carried out in the same vacuum apparatus used in the deposition steps to again lower the risk of contamination of the integrated circuit structure.

Having thus described the invention, what is claimed is:

1. A process for planarizing an integrated circuit structure in an apparatus which comprises:
    (a) depositing a first layer of an insulating material over said integrated circuit structure in a chemical vapor deposition zone in said apparatus;
    (b) depositing over said insulating layer a flowable inorganic planarizing layer at a temperature high enough to permit said inorganic planarizing material to flow as it is deposited; and
    (c) dry etching said flowable inorganic planarizing layer in an etching zone in said apparatus to planarize said structure and until substantially all of said inorganic planarizing layer has been removed.

2. A process according to claim 1 wherein said inorganic planarizing layer is capable of being etched at about the same rate as said insulating layer.

3. A process according to claim 1 wherein said inorganic planarizing layer is a glass.

4. A process according to claim 1 wherein said insulating material is silicon oxide.

5. A process according to claim 1 wherein said integrated circuit structure having said insulating layer and said planarizing layer thereon is transferred to an etching zone without exposing said integrated circuit structure to the ambient atmosphere.

6. A process according to claim 1 wherein said integrated circuit structure having said insulating layer and said planarizing layer thereon is transferred to an etching zone in said apparatus without exposing said integrated circuit structure to the ambient atmosphere.

7. A process according to claim 1 wherein both said insulating layer and said planarizing layer are deposited sequentially in a chemical vapor deposition zone of said apparatus.

8. A process according to claim 1 wherein both said insulating layer and said planarizing layer are deposited sequentially in a chemical vapor deposition zone of said apparatus; and said integrated circuit structure having said insulating layer and said planarizing layer thereon is thereafter transferred to an etching zone in said apparatus without exposing said integrated circuit structure to the ambient atmosphere.

9. A process for planarizing an integrated circuit structure in an apparatus which comprises:
    (a) depositing a first layer of a silicon oxide insulating materials over said integrated circuit structure in a chemical vapor deposition zone in said apparatus;
    (b) then depositing over said silicon oxide insulating layer a flowable inorganic glass planarizing layer in a chemical vapor deposition zone in said apparatus at a temperature high enough to permit said inorganic planarizing material to flow as it is deposited, said flowable inorganic glass planarizing layer being capable of being etched at about the same rate as said silicon oxide insulating layer;
    (c) transferring said integrated circuit structure having said insulating layer and said planarizing layer thereon to an etching zone without exposing said integrated circuit structure to the ambient atmosphere; and
    (d) dry etching said flowable inorganic planarizing layer in an etching zone in said apparatus to planarize said structure and until substantially all of said inorganic planarizing layer has been removed.

* * * * *